US006613204B2

(12) United States Patent
Xie et al.

(10) Patent No.: US 6,613,204 B2
(45) Date of Patent: Sep. 2, 2003

(54) PRETREATMENT PROCESS FOR A SURFACE TEXTURING PROCESS

(75) Inventors: Chenggang Xie, Cedar Park, TX (US); Dean Joseph Eichman, Liberty Hill, TX (US)

(73) Assignee: SI Diamond Technology, Inc., Austin, TX (US)

( * ) Notice: Subject to any disclaimer, the term of this patent is extended or adjusted under 35 U.S.C. 154(b) by 121 days.

(21) Appl. No.: 09/778,430

(22) Filed: Feb. 7, 2001

(65) Prior Publication Data

US 2001/0047931 A1 Dec. 6, 2001

Related U.S. Application Data

(62) Division of application No. 08/427,462, filed on Apr. 24, 1995, now Pat. No. 5,628,569.

(51) Int. Cl.⁷ ............................................... C23C 14/34
(52) U.S. Cl. ............................ 204/298.04; 204/298.25; 204/298.26
(58) Field of Search ....................... 204/298.04, 298.25, 204/298.26; 451/36, 38, 75, 119, 158, 173

(56) References Cited

U.S. PATENT DOCUMENTS

| | | | |
|---|---|---|---|
| 4,858,556 A | * 8/1989 | Siebert | 204/298.26 |
| 4,952,272 A | 8/1990 | Okino et al. | 156/630 |
| 5,162,704 A | 11/1992 | Kobori et al. | 315/349 |
| 5,288,367 A | 2/1994 | Angell et al. | 156/626 |
| 5,399,238 A | 3/1995 | Kumar | 156/643 |
| 5,626,640 A | * 5/1997 | Ishitobi | 51/306 |
| 5,632,812 A | * 5/1997 | Hirabayashi | 117/94 |

OTHER PUBLICATIONS

G. K. Wehner, "Cone Formation as a Result of Whisker Growth on Ion Bombarded Metal Surfaces," *J. Vac. Sci. Technol.*, A 3(4), Jul./Aug. 1985, pp. 1821–1834.

G. K. Wehner and D. J. Hajicek, "Cone Formation on Metal Targets During Sputtering," *J. Appl. Physics*, vol. 42, No. 3, Mar. 1, 1971, pp. 1145–1149.

Bruce A. Banks, "Topography: Texturing Effects," *Handbook of Ion Beam Processing Technology*, No. 17, p. 338–361.

* cited by examiner

*Primary Examiner*—Rodney G. McDonald
(74) *Attorney, Agent, or Firm*—Kelly K. Kordzik; Winstead Sechrest & Minick P.C.

(57) ABSTRACT

Before submitting a sample, including a first material layered upon a substrate, to an ion milling process, whereby a second material is sputtered onto the surface of the first material and the sample is then submitted to an etching process, an irregularity is formed on the surface of the first material. The overall process results in the formation of cones, or micro-tip structures, which may then be layered with a layer of low work function material, such as amorphous diamond. The irregularity in the surface of the first material may be formed by polishing, sandblasting, photolithography, or mechanical means such as scratching.

12 Claims, 7 Drawing Sheets

PRETREATMENT PROCESS FOR A SURFACE TEXTURING PROCESS

This is a division of application Ser. No. 08/427,462 filed Apr. 24, 1995 now U.S. Pat. No. 5,628,659.

TECHNICAL FIELD OF THE INVENTION

The present invention relates in general to a surface texturing process, and more particularly, to a pretreatment process performed prior to performing a surface texturing process wherein irregularities are produced on a surface to be textured using an ion beam.

BACKGROUND OF THE INVENTION

Surface texturing has many applications in electron sources, electric bonding, solar cells, optics and display devices. One of the most commonly used technologies for surface texturing is ion beam sputtering. The details of this process are described in *Cone Formation as a Result of Whisker Growth on Ion Bombarded Metal Surfaces*, G. K. Wehner, J. Vac. Sci. Technol. A3(4), pp. 1821–1834 (1985) and *Cone Formation on Metal Targets During Sputtering*, G. K. Wehner, J. Appl. Phys., Vol. 42, No. 3, pp. 1145–1149 (Mar. 1, 1971), which are hereby incorporated by reference herein, which teach that a cone (micro-tip) structure may be produced by using an ion source for etching a material, such as copper, after it has been seeded with a second material, such as molybdenum. An improvement upon this process is the subject of the above cross-referenced patent application, wherein a dual ion beam system is utilized to efficiently control the ion beam sputtering process.

For many applications, it is required that the surface textured structure be uniform in terms of the density, height and shape of the resultant cones. Additionally, for mass production manufacturing, the process should be controllable and repeatable. However, the above-noted surface texturing process using ion beam sources is difficult to control, and the structures of the cones are not as uniform as many applications require, such as for flat panel display devices.

Thus, there is a need in the art for a surface texturing process that is controllable, repeatable, and produces a uniformity of resultant cones.

SUMMARY OF THE INVENTION

The aforementioned need is satisfied by the present invention, which forms micro-tip structures (throughout this document "micro-tip" and "cone" are used interchangeably) at or near the locations upon which an irregularity has been formed in the surface of a material.

Thus, when forming micro-tips, a material layer is deposited upon a substrate. An irregularity is then formed in the surface of the material prior to loading the sample into an evacuated chamber to be subject to an ion milling process. The ion milling process sputters a seed material onto the surface of the material. An ion beam is then utilized to etch the material, resulting in cones or micro-tips being formed thereon. The irregularities are nuclei sites for collecting the seed material.

An irregularity may be formed by polishing the surface with a polishing solution, such as a diamond spray.

Alternatively, an irregularity may be formed by bombarding the surface through a sandblasting technique.

Alternatively, an irregularity may be formed using a photolithography technique, whereby a step feature is caused to be formed on the surface of the material.

Alternatively, an irregularity may be formed through a mechanical means, such as by scratching the surface with a needle.

In a preferred embodiment of the present invention, a dual ion beam system is utilized whereby one ion beam source is used to sputter the seed material onto the surface of the material, while a second ion beam source is utilized for the etching portion of the process.

In one embodiment of the present invention, the material upon which the irregularities are formed is an emitter material that may be utilized in a field emission device, wherein electrons are emitted from the formed micro-tips under the influence of a potential field.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWING

For a more complete understanding of the present invention, and the advantages thereof, reference is now made to the following descriptions taken in conjunction with the accompanying drawings, in which.

DETAILED DESCRIPTION OF A PREFERRED EMBODIMENT OF THE INVENTION

Figure 1:
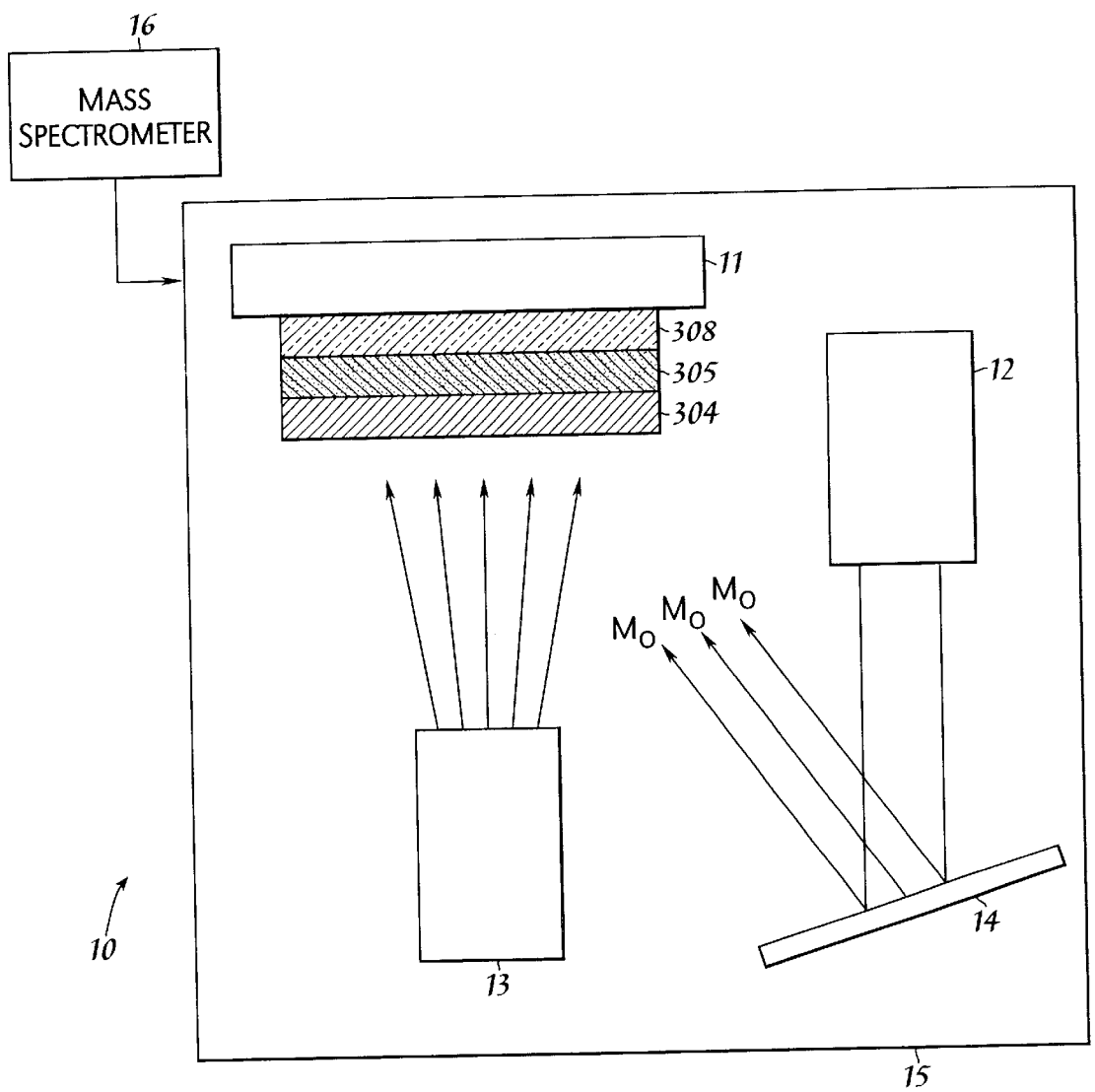
FIG. 1 illustrates a dual ion beam system for producing micro-tip structures.

In the following description, numerous specific details are set forth to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Referring first to FIG. 1, there is illustrated dual ion beam system 10 in accordance with the cross-referenced patent application Ser. No. 08/427,462 now U.S. Pat. No. 5,628,659. The ion beams produced by Kaufman ion source 13 are utilized to etch material 304, while Kaufman ion source 12 is utilized to sputter seed material onto material 304. Evacuated chamber 15 (alternatively chamber 15 may be filled with a particular gas) may be utilized to enclose system 10.

Figure 2:
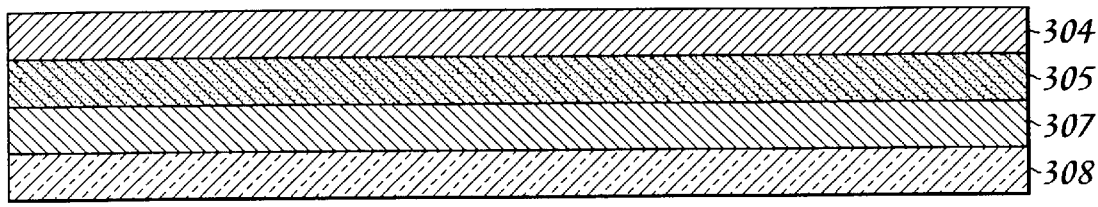
FIGS. 2 and 3 illustrate a formation of micro-tips.
Figure 3:
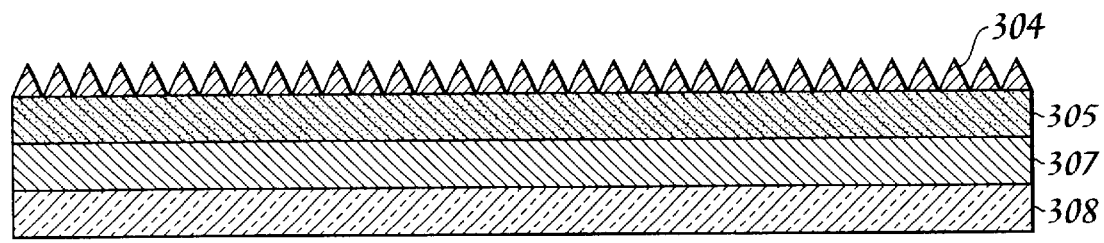

Referring to FIGS. 1, 2 and 3, glass substrate 308 is first cleaned. Next, depending upon the particular structure desired, a layer of 700 angstroms of chromium (Cr) is optionally deposited upon glass substrate 308. Next, layer 305 is deposited using electron beam evaporation, sputtering or a CVD (chemical vapor deposition) process. Layer 305 may be a resistive layer of 5,000 angstroms (0.5 $\mu$m) of amorphous silicon (a-Si). Thereafter, a 3 $\mu$m (micrometer) copper (Cu) film layer 304 is deposited upon layer 305, preferably utilizing electron beam evaporation. This entire structure, which may eventually comprise the cathode of a flat panel display is then loaded into system 10 and coupled to heater 11. Since the formation of the cones, or micro-tips, is a temperature-dependent process, heater 11 is used to assist in controlling the entire process.

Ion source 13 is utilized to etch away portions of material 304, while ion source 12 is utilized to sputter a seed material, which is preferably molybdenum (Mo), onto material 304. Ion source 13 is preferably operated with a beam energy of 800 volts and a beam current of 80 milliamps, while ion source 12 is preferably operated with a beam energy of 800 volts and a beam current of 50 milliamps. The molybdenum seed material is sputtered onto material 304 by the bombardment of molybdenum target 14 with an ion beam from ion source 12.

The result of this process implemented within dual ion beam system 10 is that portions of material 304 are etched away, resulting in cones, or micro-tips, as illustrated in FIG. 3. Please refer to *Cone Formation as a Result of Whisker Growth on Ion Bombarded Metal Surfaces* and *Cone Formation on Metal Targets During Sputtenng*, which are referenced above, which teach that such a cone structure may be produced by using one ion source for etching the material after it has been seeded with a material, such as molybdenum.

Ion beam source 13 etches away material 304 while ion beam source 12 sputters a seed material from target 14 to deposit on the surface of material 304. Note that source 12 and target 14 can be replaced with other deposition equipment, such as RF sputtering.

The structure, density and height of tips 304 are sensitive to the ratio of the etching rate and the deposition rate of the seed material. At optimized conditions, the etching rate for Cu is 8 angstroms per second and the deposition rate for Mo is 0.2 angstroms per second. These conditions are achieved at the above noted 800 volts beam voltage and 50 milliamp beam current for source 12, and 80 milliamp beam current for source 13. Very small amounts of seed material can give rise to seed cone formation in material 304. In the case of Mo seed atoms on Cu, for producing cones, the ratio of Mo atoms arriving at material 304 can be as low as one seed atom per 500 sputtered Cu target atoms. In other words, the ratio of the deposition rate to the etching rate can be as low as 1/500.

Control of this process is implemented with the assistance of mass spectrometer 16, which is utilized to monitor the etching process. Once mass spectrometer 16 detects a preselected amount of material 305, the etching process may be terminated. For example, if material 305 is amorphous silicon, then mass spectrometer 16 will monitor for a preselected amount of silicon. If a preselected amount of silicon is monitored, then the process may be terminated either manually or automatically. Please refer to U.S. patent application Ser. No. 08/320,626 now abandoned, assigned to a common assignee, which is hereby incorporated by reference herein, for a further discussion of such a process.

Note that material 304 may also be comprised of Titanium (Ti) or silver (Ag), while molybdenum may be replaced by tungsten (W).

To improve the uniformity of the surface texturing, irregularities in the surface of layer 304 may be produced. It has been found that cones 304 such as those illustrated in FIG. 3 are more likely to grow in an area where the surface of layer 304 has been "damaged" in some way. The following describes various alternative methods of "damaging" the surface of layer 304.

Hereinafter, the sample comprising glass substrate 308 with layer 304 will also be referred to as sample 53. Note that layer 305 is optional.

Figure 4:
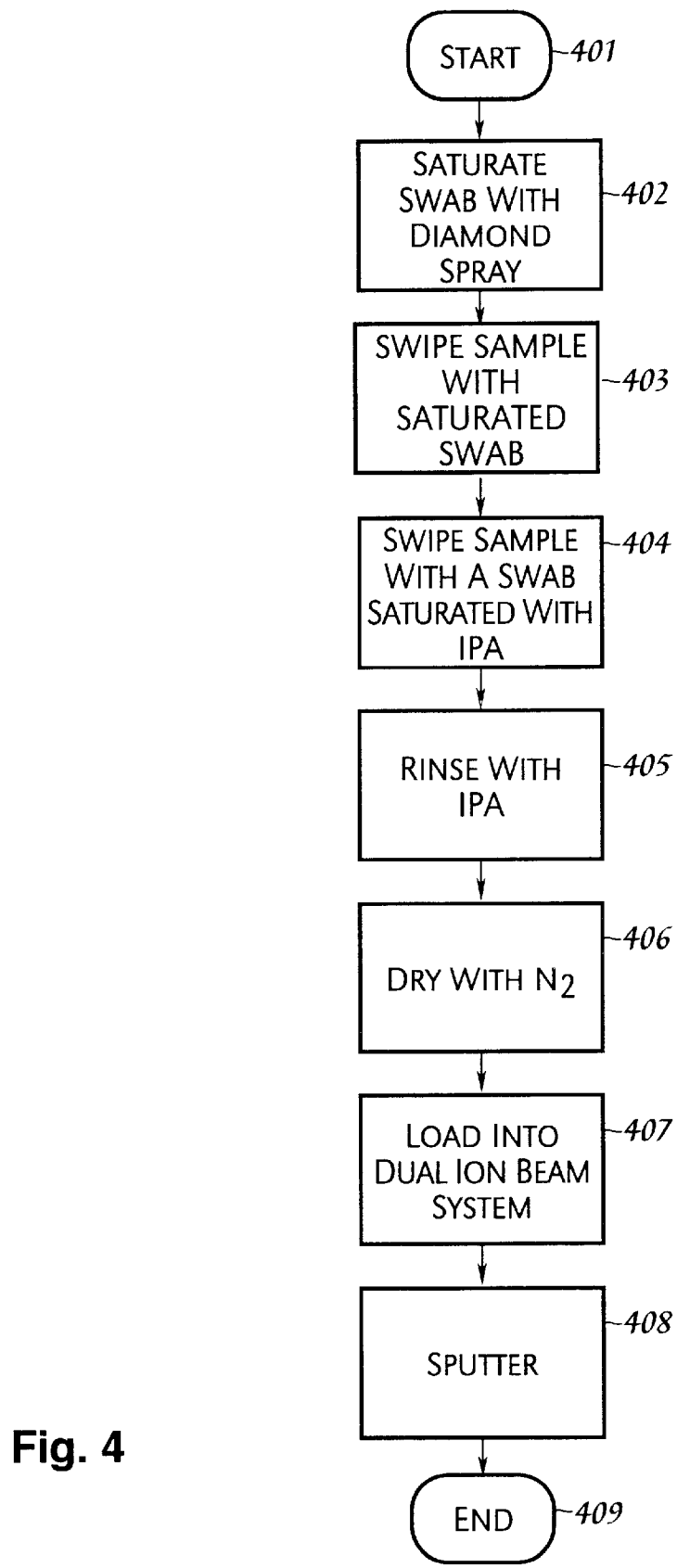
FIG. 4 illustrates a preferred embodiment of the present invention.

Referring to FIG. 4, there is illustrated a process for polishing the surface of layer 304 with a LECO® Aerosol Diamond Spray before submitting sample 53 for ion bombardment within system 10. The diamond particles within the spray are 0.25 $\mu$m in diameter. The process begins at step 401 and proceeds to step 402, wherein a fresh TX172 TEXWIPE® swab is saturated when the LECO® 0.25 $\mu$m aerosol diamond spray. Next, in step 403, sample 53 is laid face up on a clean lint-free tissue and swiped lightly from left to right approximately 46 times with the saturated swab. The fluid is then allowed to evaporate from the surface of layer 304. Thereafter, in step 404, a fresh TX172 TEXWIPE® swab is saturated with isopropyl alcohol ("IPA"), which is utilized to swipe the sample from left to right approximately 25 times. In step 405, the surface of layer 304 is then rinsed with IPA twice. In step 406, the surface is dried with dry $N_2$. Next, in step 407, sample 53 is then loaded into dual ion bean system 10 for the ion beam sputtering process described above. Using this process, the uniformity of the cone structures (including height, shape and density) is improved. This process also results in an ability to produce the cones in a more controllable and repeatable manner.

Alternatively, the diamond spray solution may be replaced with a different polishing solution comprised of 50 nm Al2O3+DI-H2O (deionized water).

Figure 5:
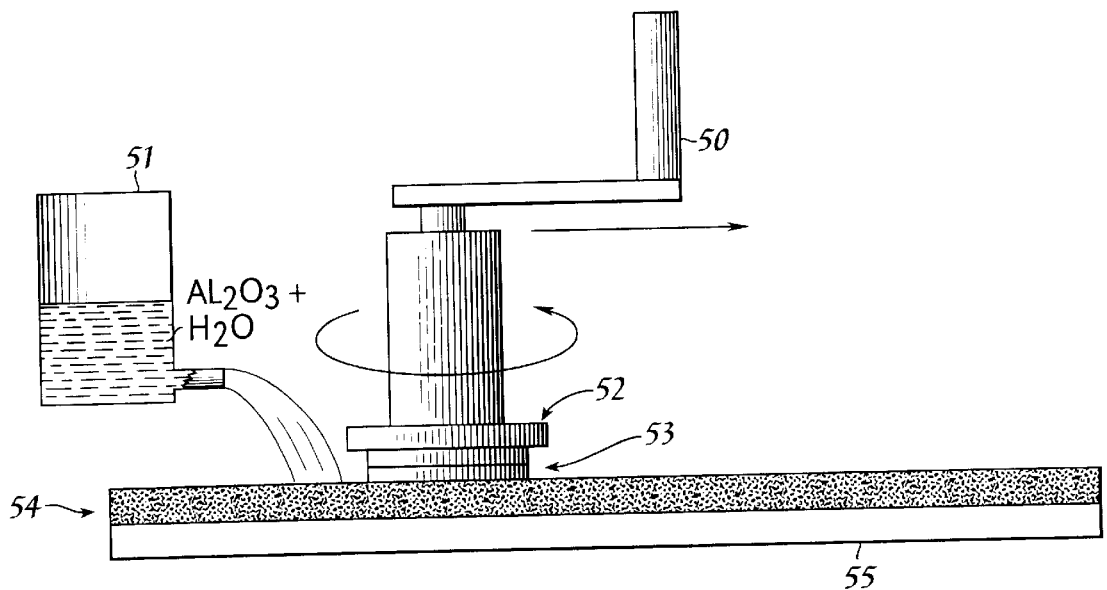
FIG. 5 illustrates an alternative embodiment of the present invention utilizing a polishing technique.

Referring next to FIG. 5, there is illustrated an apparatus for performing an alternative embodiment of the present invention, which is ideally suited for a large sample 53 size. Sample 53 is mounted to sample holder 52, which is a portion of polishing machine 50, which may be a Model 372 polisher made by Westech Systems, Inc. As noted by the arrows in FIG. 5, polishing machine 50 has an ability to slide and rotate sample 53 across the surface of polishing pad 54, which is a Rodel 750 finishing pad, which is mounted upon flat surface 55. Sample 53 may be rotated at 50 rpm. The contact pressure between pad 54 and sample 53 is preferably 1 psi (pound per square inch). The sample is preferably polished for 30 seconds. During the polishing process, a polishing may be contained within container 51 is poured onto the surface of polishing pad 54. This polishing slurry is 50 nm Alumina R90 slurry (Al2O3:DI-H20=1:10 ratio).

Figure 9:
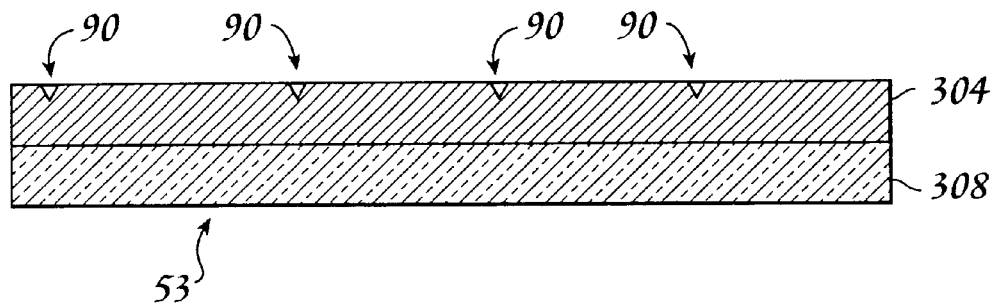
FIG. 9 illustrates a sample having had dints produced thereon.
Figure 10:
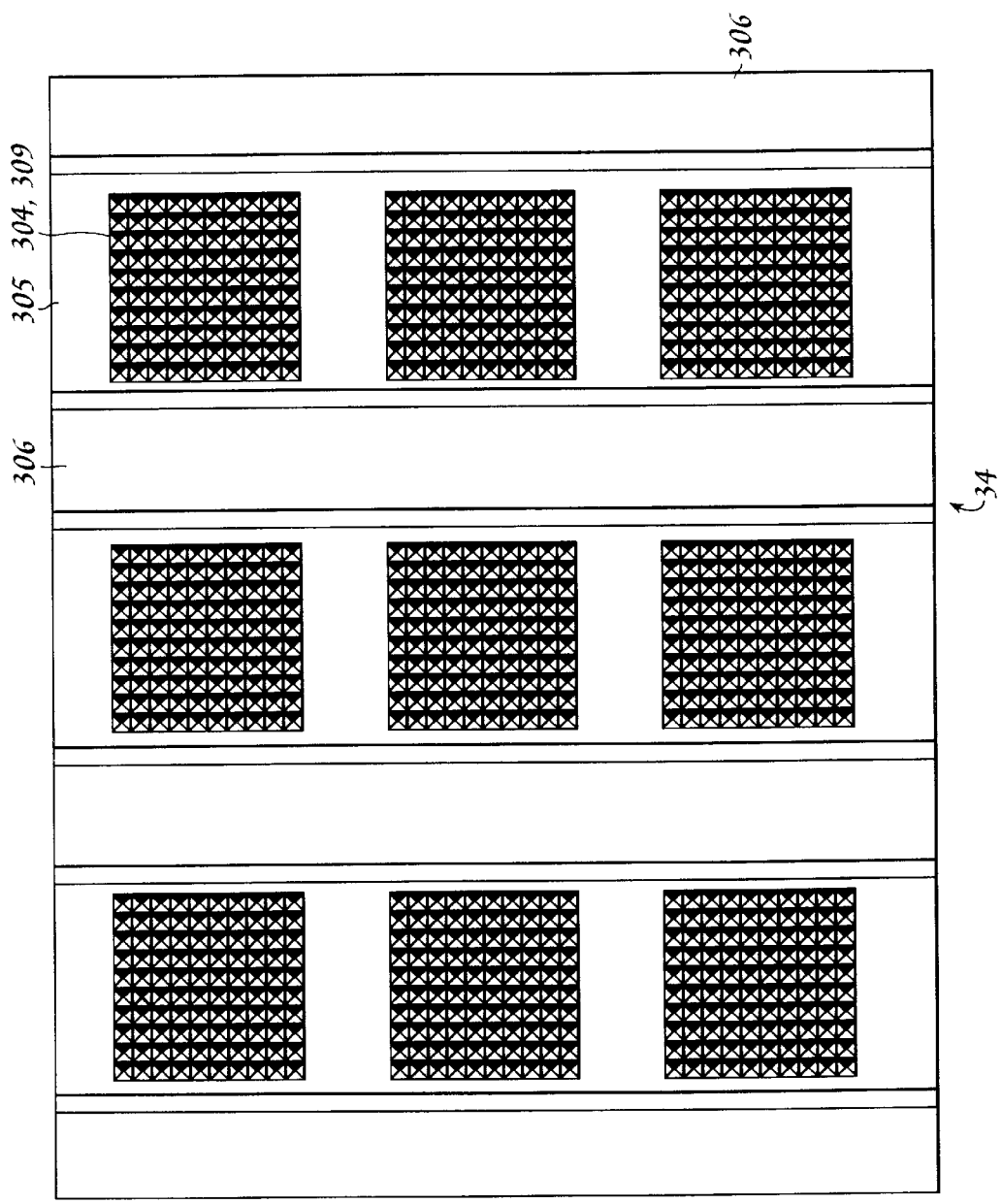
FIG. 10 illustrates a top view of an apparatus fabricated in accordance with the present invention.

The result of this polishing process is similar to the process illustrated with respect to FIG. 4, wherein defects are produced in the surface of layer 304 (see FIG. 9).

Figure 6:
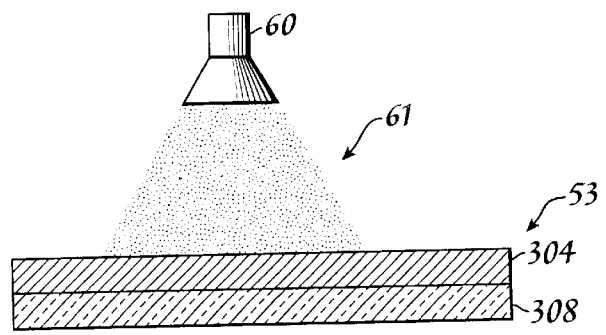
FIG. 6 illustrates an alternative embodiment of the present invention utilizing a sandblasting technique.

Referring to FIG. 6, there is illustrated another alternative embodiment of the present invention, which utilizes a sandblasting process to create the defects on the surface of layer 304 before subjecting sample 53 to the process of system 10. Sandblaster 60 (Trinco Dry Blast, Model 48/EF2) is utilized to blast the surface of layer 304 with sand particles 61 at approximately an air pressure of 15 psi. 90% of particles 61 are in the range of 148 $\mu$m–188 $\mu$m in diameter. The distance between nozzle 60 and sample 53 is preferably 15 inches. Surface finishing time is approximately one minute.

Figure 7A:
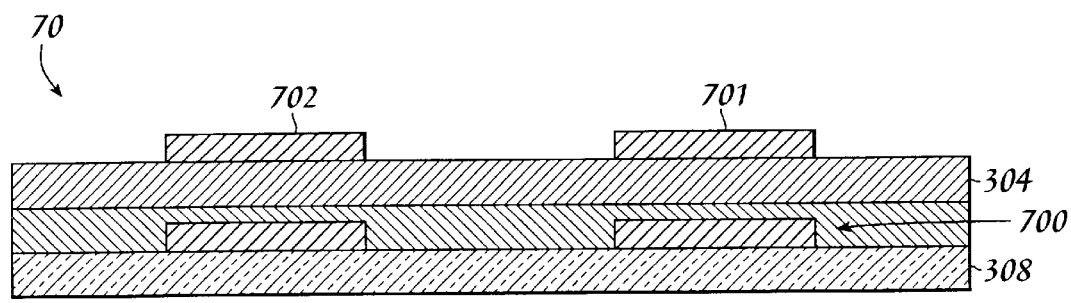
FIGS. 7A–7B illustrate an alternative embodiment of the present invention utilizing a photolithography technique.
Figure 7B:
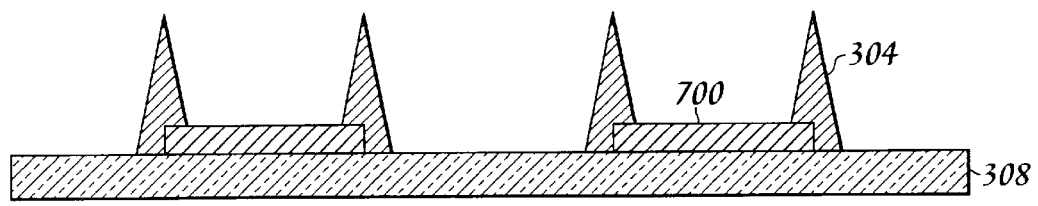

Referring next to FIGS. 7A and 7B, there is illustrated another alternative embodiment of the present invention, wherein photolithography techniques are utilized to create a minute "step" on the surface of layer 304. The cones are then grown along the edges of these created steps. With such a process, there is an ability to selectively grow the cones or micro-tips exactly where they are desired.

The first portion of this process is a deposition of a 700 angstrom layer of chromium 700 or an equivalent material on the clean surface of glass substrate 308, utilizing a sputtering technology along with photolithography in order to pattern film layer 700 into 50 µm wide strips having a separation therebetween of 50 µm. Of course, other width strips and separations may be utilized. Thereafter, a 3 µm copper film 304 or an equivalent material is deposited on top of glass substrate 308 with chromium strips 700 utilizing a sputtering technique. The result of this process is "steps" 701 and 702 on the surface of layer 304. The edges of the "steps" 701, 702 are the imperfections upon which the cones are to be grown. The entire sample 70 is then mounted in system 10 for the dual ion beam sputtering surface texturing process, which produces cones 304 as illustrated in FIG. 7B.

Figure 8:
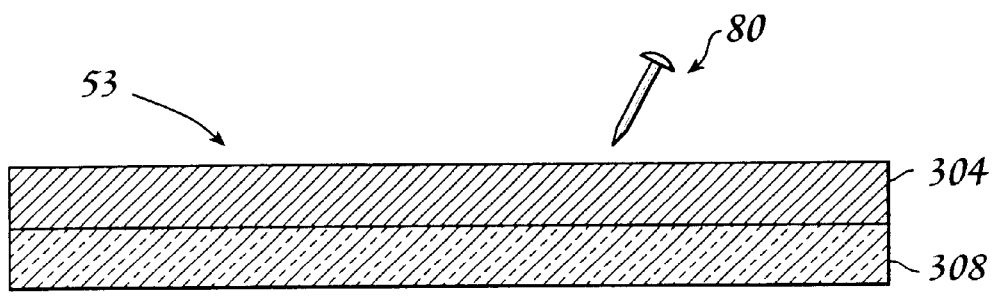
FIG. 8 illustrates an alternative embodiment of the present invention using mechanical means for creating defects in the surface of a sample.

Referring to FIG. 8, there is shown yet another alternative embodiment of the present invention wherein defects on the surface of layer 304 are produced by mechanical means such as by scratching the surface of layer 304 using a fine needle 80. Cones are then grown along the edges of the scratches.

As briefly stated above, the present invention results in cones grown near or at defects or irregularities on the surface of material 304. The aforementioned polishing processes create defects on the surface by creating a number of small dints 90 as illustrated in FIG. 9. The surface of material 304 previous to producing any type of irregularity to any of the aforementioned techniques is quite smooth and damage-free as a result of the deposition of layer 304 by RF sputtering. The irregularities are the nuclei sites for cone growth because the seed material (in this case molybdenum sputtered onto surface 304 by system 10) is likely trapped inside or adjacent to the irregularities. In other words, pretreatments (e.g., polishing, steps, sandblast, etc.) create many preferable sites for seed atoms to form clusters, which are the nuclei sites for cone growth.

Although the present invention and its advantages have been described in detail, it should be understood that various changes, substitutions and alterations can be made herein without departing from the spirit and scope of the invention as defined by the appended claims.

What is claimed is:

1. A system for surface texturing a first material, said system comprising:
   means for depositing said first material on a substrate;
   means for producing irregularities across an area of a surface of said deposited first material to increase uniformity of sites for forming structures;
   means for sputtering a second material onto a surface of said first material, wherein said substrate includes a layer of a third material on which said first material has been deposited;
   means for etching said first material; and
   a mass spectrometer for monitoring an electromagnetic spectrum originated at a location of said first material for detecting a predetermined amount of said third material.

2. The system as recited in claim 1, wherein said sputtering means includes a first ion beam originating from a first ion beam source, said first ion beam bombarding a target of said second material, and wherein said etching means includes a second ion beam originating from a second ion beam source.

3. The system as recited in claim 1, further comprising:
   means for growing microtips at the surface irregularities.

4. A system for surface texturing a first material, said system comprising:
   means for depositing said first material on a substrate;
   means for producing irregularities across an area of a surface of said deposited first material to increase uniformity of sites for forming structures, wherein said means for producing irregularities across the area of the surface of said deposited first material further comprises a means for polishing said surface with a polishing solution;
   means for sputtering a second material onto a surface of said first material; and
   means for etching said first material.

5. The system as recited in claim 4, wherein said polishing means further comprises a polishing machine coupled to said substrate, and a polishing pad on which said surface is polished.

6. The system as recited in claim 4, further comprising:
   means for growing microtips at the surface irregularities.

7. A system for surface texturing a first material, said system comprising:
   means for depositing said first material on a substrate;
   means for producing irregularities across an area of a surface of said deposited first material to increase uniformity of sites for forming structures, wherein said means for producing irregularities across the area of the surface of said deposited first material further comprises a means for sandblasting said surface;
   means for sputtering a second material onto a surface of said first material; and
   means for etching said first material.

8. The system as recited in claim 7, further comprising:
   means for growing micro tips at the surface irregularities.

9. A system for surface texturing a first material, said system comprising:
   means for depositing said first material on a substrate;
   means for producing irregularities across an area of a surface of said deposited first material to increase uniformity of sites for forming structures, wherein said means for producing irregularities across the area of the surface of said deposited first material further comprises means for depositing a strip of a third material on said substrate prior to depositing said first material on said substrate resulting in a production of a stepped surface on said first material;
   means for sputtering a second material onto a surface of said first material;
   means for etching said first material.

10. The system as recited in claim 9, further comprising:
    means for growing microtips at the surface irregularities.

11. A system for surface texturing a first material, said system comprising:
    means for depositing said first material on a substrate;
    means for producing irregularities across an area of a surface of said deposited first material to increase uniformity of sites for forming structures, wherein said means for producing irregularities across the area of the said deposited first material further comprises a means for scratching said surface;
    means for sputtering a second material onto a surface of said first material; and
    means for etching said first material.

12. The system as recited in claim 11, further comprising:
    means for growing microtips at the surface irregularities.

* * * * *